(12) United States Patent
Aranami

(10) Patent No.: US 9,496,450 B2
(45) Date of Patent: Nov. 15, 2016

(54) METHOD FOR MANUFACTURING PHOTOELECTRIC CONVERSION DEVICE

(71) Applicant: KYOCERA Corporation, Kyoto-shi, Kyoto (JP)

(72) Inventor: Junji Aranami, Otsu (JP)

(73) Assignee: KYOCERA CORPORATION, Kyoto (JP)

( * ) Notice: Subject to any disclaimer, the term of this patent is extended or adjusted under 35 U.S.C. 154(b) by 95 days.

(21) Appl. No.: 14/408,865

(22) PCT Filed: May 20, 2013

(86) PCT No.: PCT/JP2013/063920
§ 371 (c)(1),
(2) Date: Dec. 17, 2014

(87) PCT Pub. No.: WO2014/002646
PCT Pub. Date: Jan. 3, 2014

(65) Prior Publication Data
US 2015/0318431 A1    Nov. 5, 2015

(30) Foreign Application Priority Data

Jun. 29, 2012 (JP) ................................. 2012-146622

(51) Int. Cl.
*H01L 31/18* (2006.01)
*H01L 31/032* (2006.01)
*H01L 31/0749* (2012.01)
*H01L 31/046* (2014.01)

(52) U.S. Cl.
CPC ........... *H01L 31/18* (2013.01); *H01L 31/0322* (2013.01); *H01L 31/0326* (2013.01); *H01L 31/046* (2014.12); *H01L 31/0749* (2013.01); *Y02E 10/541* (2013.01)

(58) Field of Classification Search
CPC . H01L 31/18; H01L 31/046; H01L 31/0749; H01L 31/0322; H01L 31/0326; Y02E 10/541
See application file for complete search history.

(56) References Cited

U.S. PATENT DOCUMENTS

2011/0186955 A1* 8/2011 Kawano .............. H01L 31/1836
257/463

FOREIGN PATENT DOCUMENTS

| JP | 2000-299486 A | 10/2000 |
| JP | 2007-269589 A | 10/2007 |

OTHER PUBLICATIONS

International Search Report (Form PCT/ISA/210) dated Aug. 27, 2013 issued for PCT/JP2013/063920.

* cited by examiner

*Primary Examiner* — John P Dulka
(74) *Attorney, Agent, or Firm* — Procopio Cory Hargreaves and Savitch LLP

(57) ABSTRACT

A method for manufacturing a photoelectric conversion device, comprising: a first step of forming a buffer layer on a light absorption layer containing a group I-III-VI compound or a group I-II-IV-VI compound; and a second step of bringing a surface of the buffer layer into contact with a first solution containing sulfide ions or hydrogen sulfide ions.

6 Claims, 9 Drawing Sheets

METHOD FOR MANUFACTURING PHOTOELECTRIC CONVERSION DEVICE

TECHNICAL FIELD

The present invention relates to a method of producing a photoelectric conversion device comprising a semiconductor layer containing a group compound or group I-II-IV-VI compound.

BACKGROUND ART

Some of photoelectric conversion devices that are used in, for example, solar power generation each comprise a light absorption layer formed of a group compound, such as CIS and CIGS, or a group I-II-IV-VI compound, such as CZTS. These photoelectric conversion devices are described in, for example, Japanese Unexamined Patent Application Publication No. 2000-299486 and Japanese Unexamined Patent Application Publication No. 2007-269589.

The photoelectric conversion device comprising such a light absorption layer has a structure composed of a plurality of photoelectric conversion cells arranged in a planar form. The photoelectric conversion cells are each composed of a lower electrode such as a metal electrode, a photoelectric conversion layer including a light absorption layer or a buffer layer, and an upper electrode such as a transparent electrode or a metal electrode layered in this order on a substrate such as a glass substrate. The photoelectric conversion cells are electrically connected in series by electrically connecting the upper electrode of one of two adjacent photoelectric conversion cells to the lower electrode of the other photoelectric conversion cell with a connecting conductor.

The photoelectric conversion device is always required to be improved in the photoelectric conversion efficiency. The photoelectric conversion efficiency is the ratio of conversion from solar energy into electrical energy in a photoelectric conversion device and is derived by, for example, dividing the electrical energy value output from a photoelectric conversion device by the solar energy incident on the photoelectric conversion device and multiplying the result by 100.

Japanese Unexamined Patent Application Publication No. 2000-299486

Japanese Unexamined Patent Application Publication No. 2007-269589

SUMMARY OF INVENTION

It is an object of the present invention to improve the photoelectric conversion efficiency of a photoelectric conversion device.

A method of producing a photoelectric conversion device according to an embodiment of the present invention comprises a first step of forming a buffer layer containing a metal sulfide on a light absorption layer containing a group I-III-VI compound or a group I-II-IV-VI compound and a second step of bringing a first solution containing sulfide ions or hydrogen sulfide ions into contact with the surface of the buffer layer.

According to the embodiment of the present invention, a photoelectric conversion device exhibiting a high photoelectric conversion efficiency can be provided.

DESCRIPTION OF EMBODIMENTS

Figure 1:
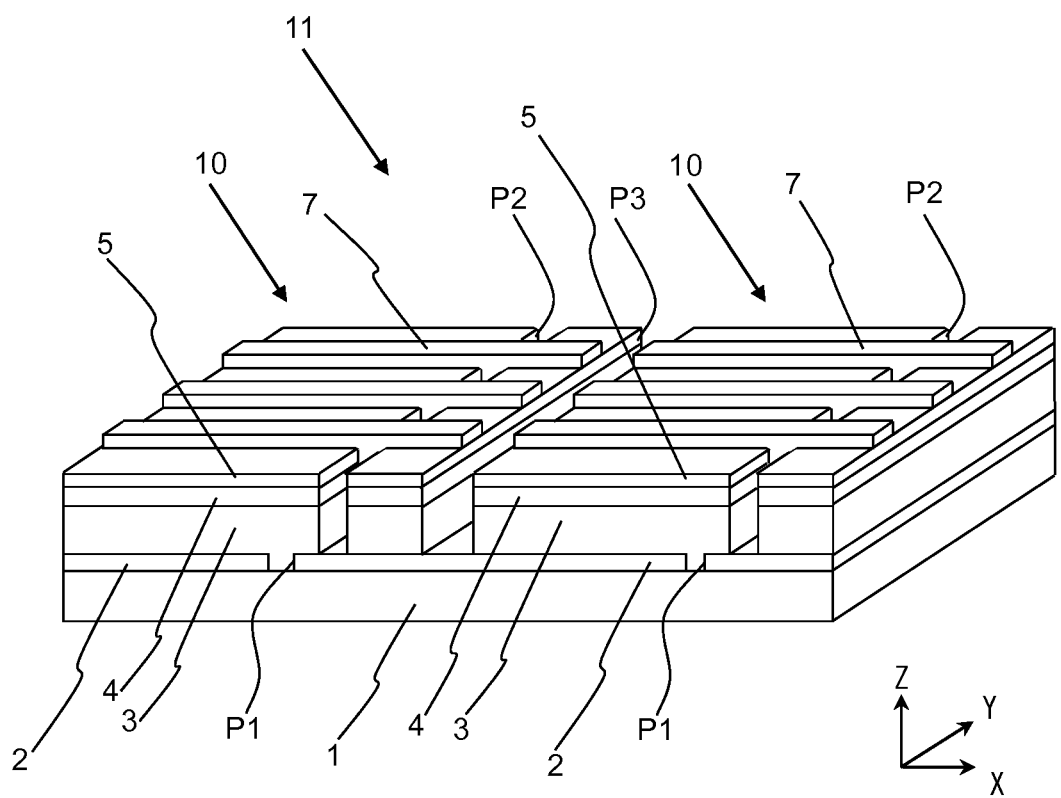
FIG. 1 is a perspective view illustrating an example of the photoelectric conversion device produced by a method of producing a photoelectric conversion device according to an embodiment of the present invention.

A method of producing a photoelectric conversion device according to an embodiment of the present invention will now be described in detail with reference to the accompanying drawings. In the drawings, the portions having the same structures and functions are denoted by the same symbols, and duplicate explanations are omitted in the following description. The drawings are schematic, and the sizes, positional relations, and other factors of each structure in each drawing are not accurately drawn.

<(1) Structure of Photoelectric Conversion Device>

Figure 2:
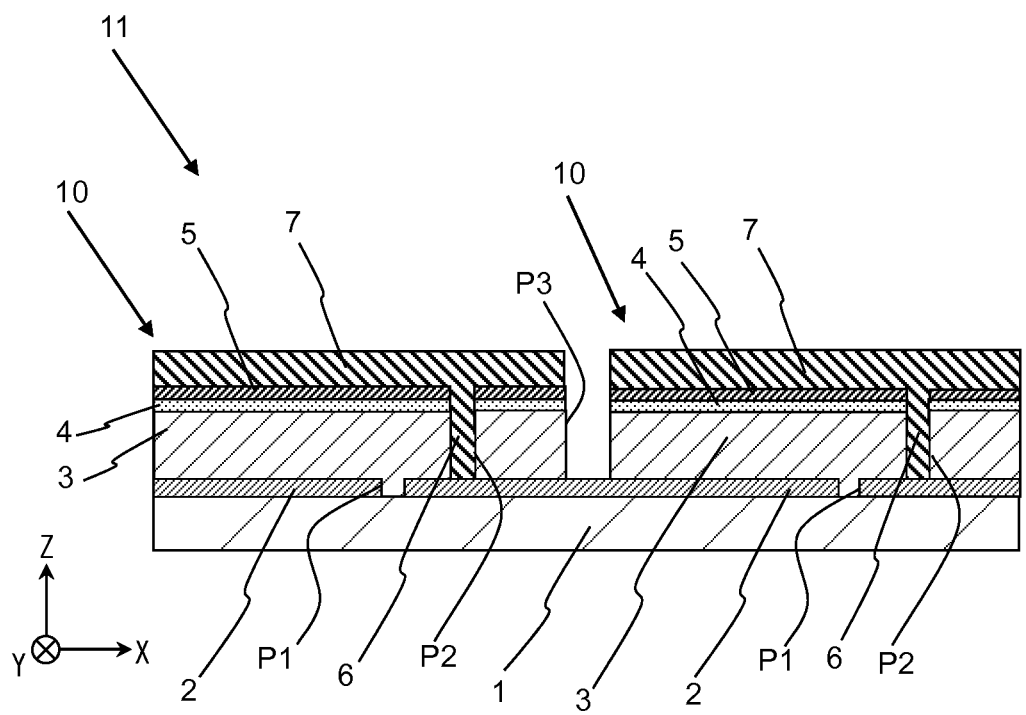
FIG. 2 is a cross-sectional view of the photoelectric conversion device shown in FIG. 1.

FIG. 1 is a perspective view illustrating an example of the photoelectric conversion device 11 produced by a method of producing a photoelectric conversion device according to an embodiment of the present invention. FIG. 2 is an XZ cross-sectional view of the photoelectric conversion device 11 shown in FIG. 1. In FIGS. 1 to 9, a right-hand XYZ coordinate system whose X-axis (the horizontal direction in the view of FIG. 1) is the direction of the alignment of the photoelectric conversion cells 10 is used.

The photoelectric conversion device 11 has a structure comprising a plurality of photoelectric conversion cells 10 arranged on a substrate 1. Although FIG. 1 shows only two photoelectric conversion cells 10 for convenience of illustration, an actual photoelectric conversion device 11 comprises a large number of photoelectric conversion cells 10 aligned in a planar form (two-dimensionally) in the X-axis direction of the drawing or also in the Y-axis direction of the drawing.

Each photoelectric conversion cell 10 is mainly composed of a lower electrode layer 2, a light absorption layer 3, a buffer layer 4, an upper electrode layer 5, and collection electrodes 7. In the photoelectric conversion device 11, the principal surface on the side where the upper electrode layer 5 and the collection electrodes 7 are disposed is the light receiving surface. The photoelectric conversion device 11 is further provided with three types of grooves: first grooves P1, second grooves P2, and third grooves P3.

The substrate 1 supports the photoelectric conversion cells 10 and is made of a material such as glass, a ceramic, a resin, or a metal. Specifically, for example, the substrate 1 may be a blue sheet glass (soda-lime glass) having a thickness of about 1 to 3 mm.

The lower electrode layer 2 is an electrically conductive layer disposed on a principal surface of the substrate 1 and is made of, for example, a metal such as molybdenum (Mo), aluminum (Al), titanium (Ti), tantalum (Ta), or gold (Au) or a layered structure of these metals. The lower electrode layer 2 has a thickness of about 0.2 to 1 μm and is formed by a known thin film-forming method such as sputtering or vapor deposition.

The light absorption layer 3 is a semiconductor layer having a first conductivity type (herein, p-type conductivity) disposed on the principal surface on the +Z side (also referred to as a principal surface) of the lower electrode layer 2 and has a thickness of about 1 to 3 μm. The light absorption layer 3 is a semiconductor layer mainly comprising a group compound I-III-VI or a group I-II-IV-VI compound. A semiconductor layer mainly comprising a group I-III-VI compound or a group I-II-IV-VI compound contains 70 mol % or more of a group compound or a group I-II-IV-VI compound.

The group I-III-VI compound consists of a group I-B element (also referred to as group 11 element), a group III-B element (also referred to as group 13 element), and a group VI-B element (also referred to as group 16 element). The group I-II-IV-VI compound consists of a group I-B element, a group II-B element (also referred to as group 12 element), a group IV-B element (also referred to as group 14 element), and a group VI-B element.

Examples of the group I-III-VI compound include $CuInSe_2$ (copper indium diselenide, also referred to as CIS), $Cu(In,Ga)Se_2$ (copper indium-gallium diselenide, also referred to as CIGS), and $Cu(In,Ga)(Se,S)_2$ (copper indium-gallium diselenide-disulfide, also referred to as CIGSS). The light absorption layer 3 may be a laminate of a plurality of layers, for example, may consist of a CIGS layer and a surface layer of a thin CIGSS layer.

Examples of the group I-II-IV-VI compound include $Cu_2ZnSnS_4$ (also referred to as CZTS), $Cu_2ZnSn(S,Se)_4$ (also referred to as CZTSSe), and $Cu_2ZnSnSe_4$ (also referred to as CZTSe).

The buffer layer 4 is a semiconductor layer in a heterojunction with the light absorption layer 3. The buffer layer 4 may have a conductivity type (herein, an n-type conductivity) different from that of the light absorption layer 3. A different conductivity type means that the conductive carrier (carrier) of the semiconductor is different. As described above, when the light absorption layer 3 has a p-type conductivity, the buffer layer 4 may have an n-type or i-type conductivity. Alternatively, in another embodiment, the light absorption layer 3 may have an n-type or i-type conductivity, and the buffer layer 4 may have a p-type conductivity.

The buffer layer 4 is made of a compound semiconductor, such as cadmium sulfide (CdS), indium sulfide ($In_2S_3$), zinc sulfide (ZnS), zinc oxide (ZnO), indium selenide ($In_2Se_3$), In(OH,S), (Zn,In)(Se,OH), or (Zn,Mg)O. From the viewpoint of reducing current loss, the buffer layer 4 can have a resistivity of 1Ω·cm or more. The buffer layer 4 can be formed by, for example, chemical bath deposition (CBD).

The buffer layer 4 has the thickness in the direction normal to a principal surface of the light absorption layer 3. The thickness is set to be, for example, 10 to 200 nm.

The upper electrode layer 5 is a transparent conductive film disposed on the buffer layer 4 and having a second conductivity type (herein, n-type conductivity) and is an electrode for extracting the charge generated in the light absorption layer 3. The upper electrode layer 5 is made of a material having a resistivity lower than that of the buffer layer 4. The upper electrode layer 5 may be a so-called window layer. When the upper electrode layer 5 is composed of the window layer and a transparent conductive film, these layers may be regarded as an integrated upper electrode layer 5.

The upper electrode layer 5 mainly comprises a transparent material having a broad band gap and a low resistivity. Usable examples of the material include metal oxide semiconductors, such as ZnO, $In_2O_3$, and $SnO_2$. These metal oxide semiconductors may contain elements such as Al, B, Ga, In, Sn, Sb, and F. Examples of the metal oxide semiconductor containing such an element include AZO (aluminum zinc Oxide), GZO (gallium zinc oxide), IZO (indium zinc oxide), ITO (indium tin oxide), and FTO (fluorine tin oxide).

The upper electrode layer 5 is formed to have a thickness of 0.05 to 3 μm by, for example, sputtering, vapor deposition, or chemical vapor deposition. From the viewpoint of well extracting the charge from the light absorption layer 3, the upper electrode layer 5 can have a resistivity of 1Ω·cm or less and a sheet resistance of 50Ω/□ or less.

The buffer layer 4 and the upper electrode layer 5 can be made of materials readily transmitting light (also referred to as optical transparency) in the wavelength range of light that is absorbed by the light absorption layer 3. Consequently, a reduction in the light absorption efficiency of the light absorption layer 3 due to the presence of the buffer layer 4 and the upper electrode layer 5 is decreased.

From the viewpoint of well transferring the current generated by photoelectric conversion in addition to the viewpoint of increasing the optical transparency, the upper electrode layer 5 can have a thickness of 0.05 to 0.5 μm.

The collection electrodes 7 are disposed with spaces therebetween in the Y-axis direction and each extend in the X-axis direction. The collection electrodes 7 are electrically conductive electrodes made of, for example, a metal such as silver (Ag).

The collection electrodes 7 each collect the charge generated in the light absorption layer 3 and extracted by the upper electrode layer 5. The thickness of the upper electrode layer 5 can be reduced by disposing the collection electrodes 7.

The charge collected by the collection electrodes 7 and the upper electrode layer 5 is transferred to the adjacent photoelectric conversion cell 10 via a connecting conductor 6 disposed in the second groove P2. For example, as shown in FIG. 2, the connecting conductor 6 is configured with the extending portion of the collection electrode 7 in the Y-axis direction. Consequently, in the photoelectric conversion device 11, the lower electrode layer 2 of one of two adjacent photoelectric conversion cells 10 and the collection electrode 7 of the other photoelectric conversion cell 10 are electrically connected in series via the connecting conductor 6 disposed in the second groove P2. The connecting conductor 6 is not limited to this and may be configured with the extending portion of the upper electrode layer 5.

The collection electrode 7 can have a width of 50 to 400 μm for minimizing the reduction of the light-receiving area, which influences the amount of light incident on the light absorption layer 3, while maintaining the high electrical conductivity.

<(2) Method of Producing Photoelectric Conversion Device>

FIGS. 3 to 9 are each a cross-sectional view schematically illustrating a state on the way of producing a photoelectric conversion device and are each a cross-sectional view illustrating a state on the way of producing the portion corresponding to the cross section shown in FIG. 2.

Figure 3:
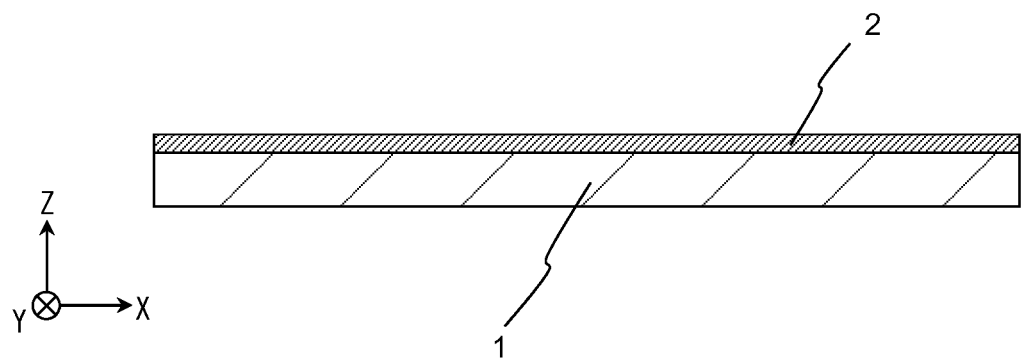
FIG. 3 is a cross-sectional view schematically illustrating a state on the way of producing a photoelectric conversion device.
Figure 4:
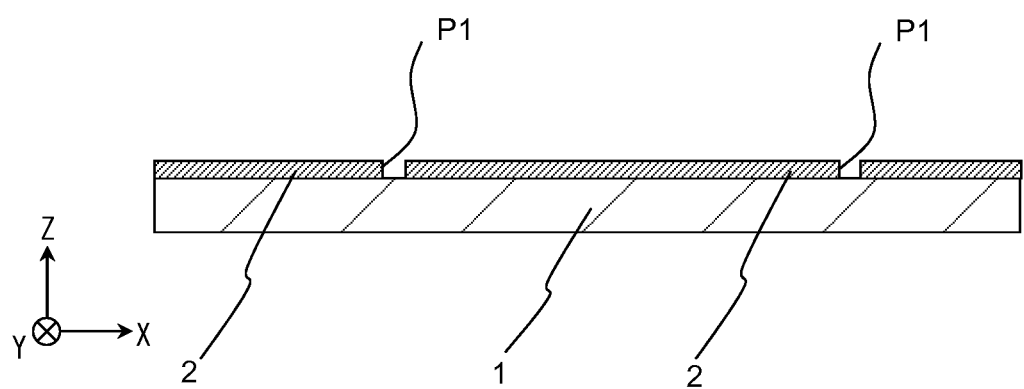
FIG. 4 is a cross-sectional view schematically illustrating a state on the way of producing a photoelectric conversion device.

First, as shown in FIG. 3, a lower electrode layer 2 of, for example, Mo is formed by sputtering or another method on the approximately entire surface of a washed substrate 1. Subsequently, first grooves P1 linear along the Y direction are formed from the groove-forming positions on the upper surface of the lower electrode layer 2 to the upper surface of the substrate 1 just under the positions. The first groove P1 can be formed, for example, scribing for grooving the groove-forming position with laser light such as a YAG laser with scanning the laser light. FIG. 4 is a diagram illustrating a state after formation of the first grooves P1.

Figure 5:
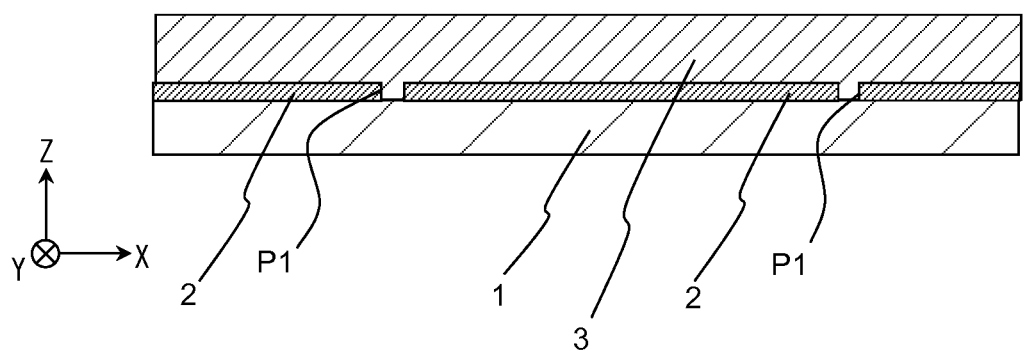
FIG. 5 is a cross-sectional view schematically illustrating a state on the way of producing a photoelectric conversion device.

After the formation of the first grooves P1, a light absorption layer 3 is formed on the lower electrode layer 2. The light absorption layer 3 can be formed not only by a vacuum process, such as sputtering or vapor deposition, but also by a process called application or printing. In the process called application or printing, a complex solution of an element constituting the light absorption layer 3 is applied onto the lower electrode layer 2 and is then subjected to drying and heating treatment. FIG. 5 is a diagram illustrating a state after formation of the light absorption layer 3.

Figure 6:
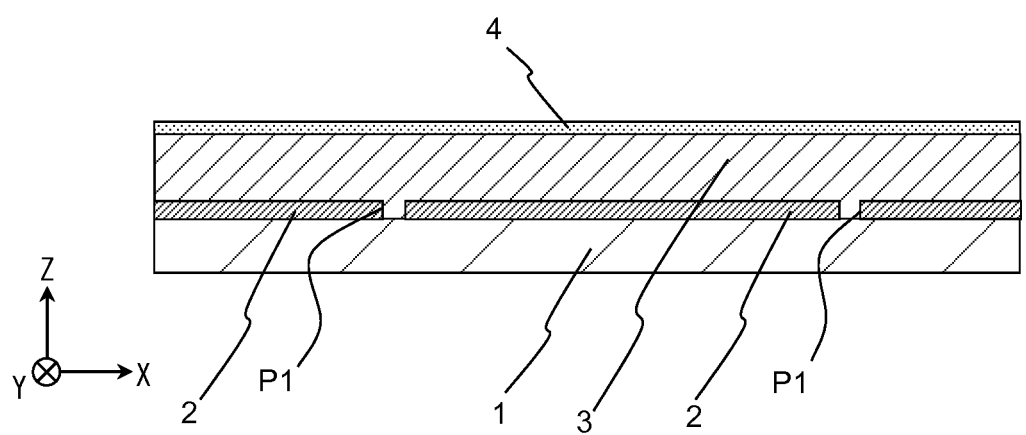
FIG. 6 is a cross-sectional view schematically illustrating a state on the way of producing a photoelectric conversion device.

After the formation of the light absorption layer 3, a buffer layer 4 is formed on the light absorption layer 3 (first step). The buffer layer 4 can be formed by a solution growth method (also referred to as CBD method). For example, a metal source such as cadmium acetate or indium chloride and a sulfur source such as thiourea are dissolved in water, and the substrate 1 after the formation of the light absorption layer 3 is immersed in the resulting solution to form a buffer layer 4 containing CdS or $In_2S_3$ on the light absorption layer 3. FIG. 6 is a diagram illustrating a state after formation of the buffer layer 4.

After the formation of the buffer layer 4, a first solution containing sulfide ions or hydrogen sulfide ions is brought into contact with a surface of the buffer layer 4 (second step). Examples of the first solution include aqueous solution of $H_2S$, aqueous solution of an alkali metal sulfide such as $Na_2S$ or $K_2S$, and aqueous solution of a thioamide derivative such as thiourea or thioacetamide. These compounds are used in a concentration of, for example, 1 to 100 mM. These compounds are ionized or hydrolyzed in the solution to give sulfide ions or hydrogen sulfide ions. The first solution may contain both sulfide ions and hydrogen sulfide ions. The solvent used in the first solution is not limited to water and may be a solvent mixture of water and a polar organic solvent such as lower alcohol (having 3 or less carbon atoms). Herein, used as the first solution is a solution that does not form a metal sulfide film on the surface of the buffer layer 4 when it is in contact with the buffer layer 4. That is, metal ions other than alkali metal ions are not contained in the first solution, and even if such metal ions are contained, the concentration is 1/1000 or less of the molar concentration of sulfur atoms in the first solution, which does not affect the surface of the buffer layer 4.

The first solution may be brought into contact with the surface of the buffer layer 4 by, for example, immersing the substrate 1 after the formation of the buffer layer 4 in the first solution or by applying the first solution for deposition to the surface of the buffer layer 4. In the case of immersing the substrate 1 after the formation of the buffer layer 4 in the first solution, the substrate 1 is extracted from the first solution after immersion for a prescribed time and is then washed with water as necessary. In this case, stable treatment without causing variation can be performed. In the case of deposition by applying the first solution to the surface of the buffer layer 4, after the deposition for a prescribed time, the first solution on the buffer layer 4 is removed, and washing with water is optionally performed. In this case, the amount of the first solution can be small.

The temperature of the first solution when it is brought into contact with the surface of the buffer layer 4 may be, for example, 20° C. to 80° C. The first solution may be in contact with the surface of the buffer layer 4 for 1 to 60 minutes for example.

The application of the first solution after formation of the buffer layer 4 on the light absorption layer 3 can provide good electrical characteristics to the buffer layer 4 and improves the photoelectric conversion efficiency of the photoelectric conversion device 11. This is believed to be caused by that defects on the surface of the buffer layer 4 or at the interface between the light absorption layer 3 and the buffer layer 4 can be satisfactorily filled with sulfur element.

From the viewpoint of readily allowing more satisfactory filling of the defects with sulfur element, the first solution may be basic. In the basic first solution containing water as the solvent, the pH may be adjusted to be, for example, 9 to 12.

From the viewpoint of satisfactorily filling defects due to a loss of the group I-B at the interface between the light absorption layer 3 and the buffer layer 4 and further improving the photoelectric conversion efficiency, the first solution may contain alkali metal ions. The source of the alkali metal ions may be $Na_2S$ or an alkali metal compound such as $K_2S$, NaCl, or NaOH.

After the contact of the first solution with the surface of the buffer layer 4, the light absorption layer 3 and the buffer layer 4 may further annealed at, for example, 100° C. to 250° C. for, for example, 10 to 180 minutes. The annealing can further increase the photoelectric conversion efficiency.

From the viewpoint of increasing the thickness of the buffer layer 4 while decreasing the defects of the buffer layer 4, the method may include a third step of forming another buffer layer (second buffer layer) on the surface of the buffer layer (referred to as first buffer layer) formed by the first step and the second step. This is based on the following reason: If a buffer layer 4 having a large thickness is formed in one step, the crystallinity in the surface portion on the opposite side of the light absorption layer 3 is deteriorated to tend to increase defects. Accordingly, a first buffer layer having high crystallinity and less defects on the surface can be formed by forming a first buffer layer 4 with an appropriate thickness and then treating the first buffer layer 4 in the second step. Subsequently, a second buffer layer is formed on the surface of the first buffer layer by performing the film-forming step again. As a result, the second buffer layer is well formed on the surface of the first buffer layer having less defects to give a buffer layer 4 having less defects and a large thickness.

Figure 7:
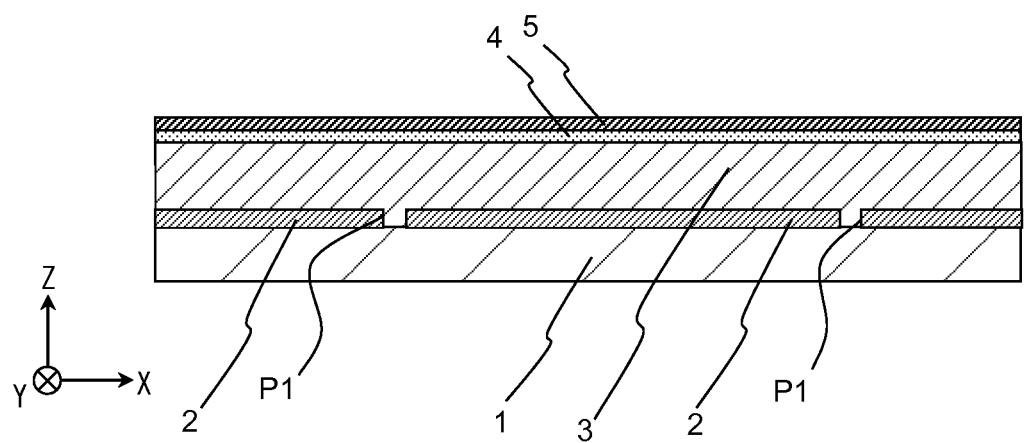
FIG. 7 is a cross-sectional view schematically illustrating a state on the way of producing a photoelectric conversion device.

After the treatment of the buffer layer 4 as described above, an upper electrode layer 5 is formed on the buffer layer 4. The upper electrode layer 5 is a transparent conductive film mainly composed of, for example, indium oxide containing Sn (ITO), zinc oxide containing Al (AZO), or zinc oxide containing B (BZO) and can be formed by, for example, sputtering, vapor deposition, or CVD. FIG. 7 is a diagram illustrating a state after formation of the upper electrode layer 5.

Figure 8:
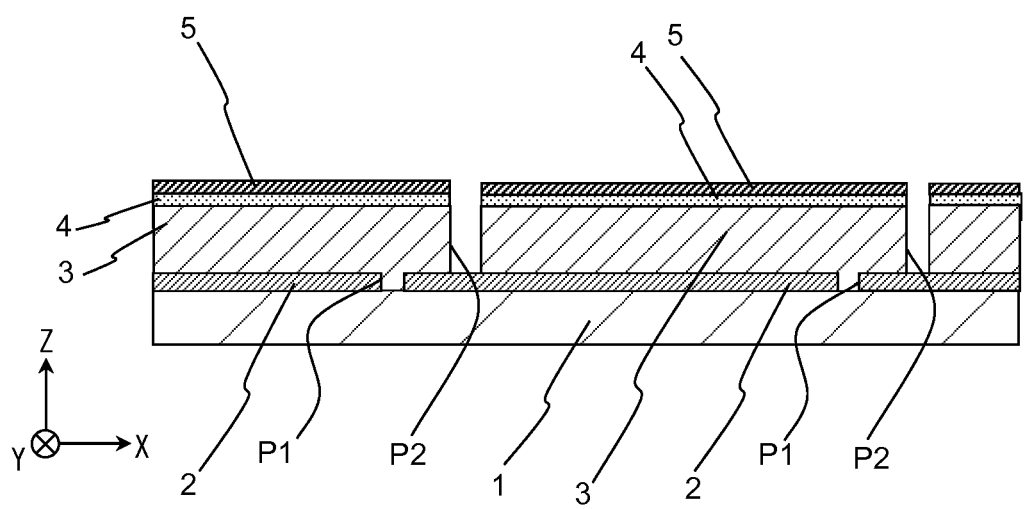
FIG. 8 is a cross-sectional view schematically illustrating a state on the way of producing a photoelectric conversion device.

After the formation of the upper electrode layer 5, second grooves P2 linear along the Y direction are formed from the groove-forming positions on the upper surface of the upper electrode layer 5 to the upper surface of the lower electrode layer 2 just under the positions. The second grooves P2 can be formed by, for example, scribing with a scribing needle having a scribe width of about 40 to 50 μm. FIG. 8 is a diagram illustrating a state after formation of the second grooves P2. The second grooves P2 are formed at positions slightly shifted in the X direction (in the drawing, +X direction) from the positions of the corresponding first grooves P1.

Figure 9:
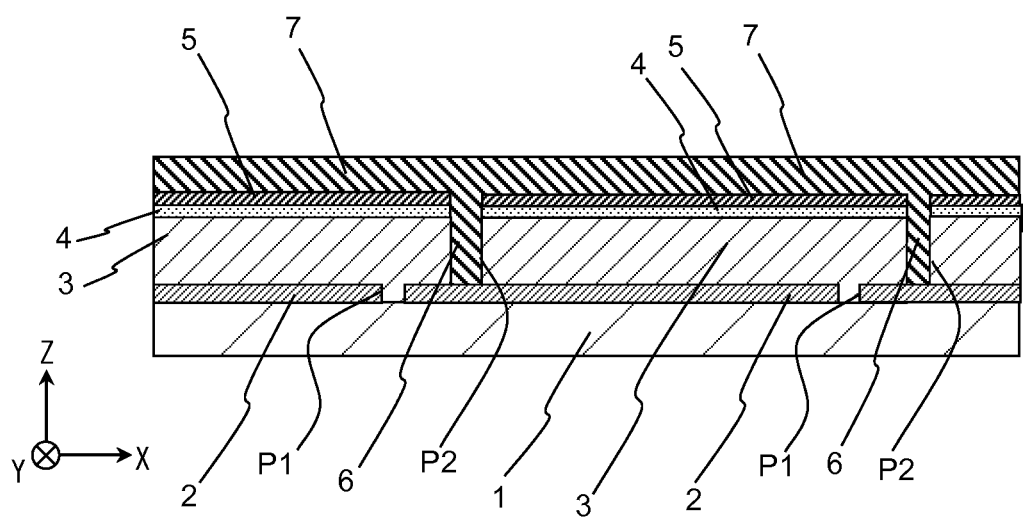
FIG. 9 is a cross-sectional view schematically illustrating a state on the way of producing a photoelectric conversion device.

After the formation of the second grooves P2, a collection electrode 7 and connecting conductors 6 are formed. The collection electrode 7 and the connecting conductors 6 can be formed by, for example, printing a desired pattern by a paste having electrical conductivity (also referred to as conductive paste) in which a powder of a metal such as Ag is dispersed in, for example, a resin binder and solidifying the paste. FIG. 9 is a diagram illustrating a state after formation of the collection electrode 7 and the connecting conductors 6.

After the formation of the collection electrode 7 and the connecting conductors 6, linear third grooves P3 are formed from the groove-forming positions on the upper surface of the upper electrode layer 5 to the upper surface of the lower electrode layer 2 just under the positions. The third grooves P3 each can have a width of, for example, about 40 to 1000 µm. The third grooves P3 can be formed by mechanical scribing as in the formation of the second grooves P2. Thus, the production of a photoelectric conversion device 11 shown in FIGS. 1 and 2 is completed by the formation of the third grooves P3.

The present invention is not limited to the above-described embodiments and can be variously modified and improved within a scope not departing from the gist of the present invention.

EXAMPLES

A method of producing the photoelectric conversion device 11 will now be described by examples.

First, a raw material solution for forming the light absorption layer 3 was produced. The raw material solution was prepared by dissolving a single source precursor in pyridine in accordance with the description in U.S. Pat. No. 6,992,202. The single source precursor was a mixture of complex molecules each consisting of Cu, In, and phenylselenol and complex molecules each consisting of Cu, Ga, and phenylselenol.

Subsequently, a plurality of glass substrates 1 each provided with a lower electrode layer 2 of Mo on a surface was prepared, and a film was formed on the lower electrode layer 2 by applying the raw material solution prepared above by a blade method.

Subsequently, this film was heated at 550° C. for 1 hour in a hydrogen gas atmosphere containing selenium vapor at a partial pressure of 20 ppmv. As a result, a light absorption layer 3 mainly composed of CIGS and having a thickness of 2 µm was formed.

Subsequently, each substrate after the formation of the light absorption layer 3 was immersed in an aqueous solution containing indium chloride and thiourea to form a buffer layer 4 containing $In_2S_3$ and having a thickness of 50 nm on the light absorption layer 3.

These substrates after the formation of the buffer layer 4 were subjected to treatment of eleven different conditions shown in Table 1, respectively.

TABLE 1

| Sample | First solution | pH | Annealing after treatment with first solution | Photoelectric conversion efficiency (%) |
|---|---|---|---|---|
| 1 | $Na_2S$ (8 mM) aqueous solution | 10.5 | None | 14.5 |
| 2 | $Na_2S$ (8 mM) + NaOH (2.3 mM) aqueous solution | 10.8 | None | 14.9 |
| 3 | $Na_2S$ (8 mM) + NaCl (71 mM) + NaOH (2.3 mM) aqueous solution | 10.8 | None | 15.1 |
| 4 | $Na_2S$ (8 mM) aqueous solution | 10.5 | 170° C., 1 hr | 14.9 |
| 5 | $Na_2S$ (8 mM) aqueous solution | 10.5 | 200° C., 1 hr | 15.3 |
| 6 | $Na_2S$ (8 mM) aqueous solution | 10.5 | 225° C., 1 hr | 15.4 |
| 7 | $Na_2S$ (8 mM) aqueous solution | 10.5 | 250° C., 1 hr | 15.1 |
| 8 | $Na_2S$ (8 mM) + NaOH (2.3 mM) aqueous solution | 10.8 | 170° C., 1 hr | 15.4 |
| 9 | $Na_2S$ (8 mM) + NaCl (71 mM) + NaOH (2.3 mM) aqueous solution | 10.8 | 170° C., 1 hr | 15.5 |
| 10 | Thiourea (50 mM) + NaOH (1 mM) aqueous solution | 10.9 | 170° C., 1 hr | 14.5 |
| 11 | Not treated | — | None | 13.8 |

Specifically, the substrates after the formation of the buffer layer 4 were immersed in the corresponding first solutions (solution temperature: 60° C.) shown in Table 1 for 30 minutes. The sample 11 is a comparative sample and was not subjected to the treatment with a first solution.

Samples 4 to 10 were further annealed under the conditions shown in Table 1 after the first solution treatment.

An upper electrode layer of ZnO doped with Al was formed on the buffer layer 4 of each of samples 1 to 11 by sputtering to give 11 types of photoelectric conversion devices.

The photoelectric conversion efficiency of each of the thus-produced samples 1 to 11 was measured with a so-called fixed light solar simulator under conditions that the intensity of light irradiated on the light-receiving surface of a photoelectric conversion device was 100 mW/cm$^2$ and the air mass (AM) was 1.5. The results are shown in Table 1.

Table 1 demonstrates that the photoelectric conversion efficiencies of samples 1 to 10 treated with the first solution were higher than that of sample 11 not treated with the first solution. The photoelectric conversion efficiency of sample 2 was higher than that of sample 1, which demonstrates that the photoelectric conversion efficiency is further increased by increasing the basicity of the first solution. The photoelectric conversion efficiency of sample 3 was higher than that of sample 2, which demonstrates that the photoelectric conversion efficiency is further increased by increasing the number of alkali metal ions (Na ions). The photoelectric conversion efficiencies of samples 4 to 7 were higher than that of sample 1, the photoelectric conversion efficiency of sample 8 was higher than that of sample 2, and the photoelectric conversion efficiency of sample 9 was higher than that of sample 3. These results demonstrate that the photoelectric conversion efficiency is further increased by annealing.

REFERENCE SIGNS LIST 1 substrate
2 lower electrode layer
3 light absorption layer
4 buffer layer 5 upper electrode layer
6 connecting conductor
7 collection electrode
10 photoelectric conversion cell
11 photoelectric conversion device

The invention claimed is:

1. A method of producing a photoelectric conversion device, comprising:
   a first step of forming a buffer layer containing a metal sulfide on a light absorption layer containing a group I-III-VI compound or a group I-II-IV-VI compound; and
   a second step of bringing a surface of the buffer layer into contact with a first solution containing sulfide ions or hydrogen sulfide ions.

2. The method of producing a photoelectric conversion device according to claim 1, wherein the first solution is a basic solution.

3. The method of producing a photoelectric conversion device according to claim 1, wherein the second step is performed by immersing the light absorption layer in the first solution.

4. The method of producing a photoelectric conversion device according to claim 1 wherein the second step is performed by applying the first solution onto the buffer layer.

5. The method of producing a photoelectric conversion device according to claim 1 further comprising:
   a step of annealing the light absorption layer and the buffer layer, after the second step.

6. The method of producing a photoelectric conversion device according to claim 1 further comprising:
   a third step of forming a second buffer layer on the buffer layer, after the second step.

* * * * *